United States Patent [19]

Hirae et al.

[11] Patent Number: 5,504,437

[45] Date of Patent: Apr. 2, 1996

[54] APPARATUS AND METHOD FOR ELECTRICAL MEASUREMENT OF SEMICONDUCTOR WAFERS

[75] Inventors: Sadao Hirae; Hiroshi Okada; Hideaki Matsubara, all of Kyoto, Japan

[73] Assignee: Dainippon Screen Mfg. Co., Ltd., Japan

[21] Appl. No.: 460,053

[22] Filed: Jun. 2, 1995

[30] Foreign Application Priority Data

Jul. 25, 1994 [JP] Japan ................................. 6-193747

[51] Int. Cl.⁶ ............................. G01R 1/00; G01R 1/04
[52] U.S. Cl. ................. 324/765; 439/482; 437/8
[58] Field of Search ................................. 324/754, 755, 324/756, 757, 763

[56] References Cited

U.S. PATENT DOCUMENTS 5,034,685  1/1991  Leedy ........................ 324/754
5,177,438  1/1993  Littlebury et al. ............... 324/754
5,434,513  1/1995  Fujii et al. .................. 325/765

FOREIGN PATENT DOCUMENTS 54-26667  2/1979  Japan .

*Primary Examiner*—Kenneth A. Wieder
*Assistant Examiner*—Barry C. Bowser
*Attorney, Agent, or Firm*—Ostrolenk, Faber, Gerb & Soffen

[57] ABSTRACT

A stage 130 includes a metal base and an anti-metal contamination film formed on the metal base a semi-conductor wafer 120. The anti-metal contamination film is constructed of a material selected from the group consisting of a semi-conductor film, a semi-conductor oxide film, a semi-conductor nitride film, a semi-conductor carbide film, and a polytetrafluoroethylene film. The rear face of the semi-conductor wafer 120 mounted on the stage 130 is in direct contact with the anti-metal contamination film but not with the metal surface. The anti-metal contamination film, which does not contain simple substances of metals, effectively protects the rear face of the semi-conductor wafer 120 from contamination metal.

25 Claims, 13 Drawing Sheets

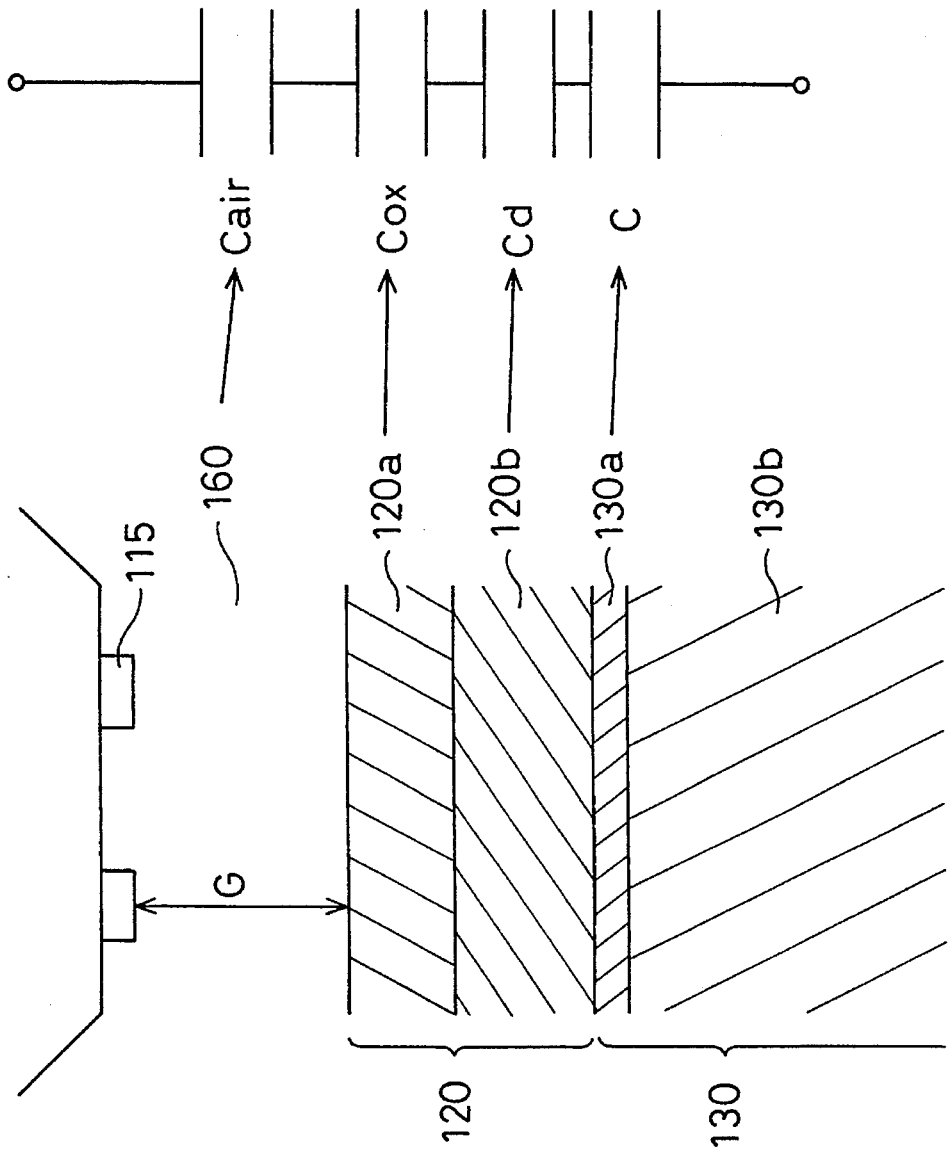

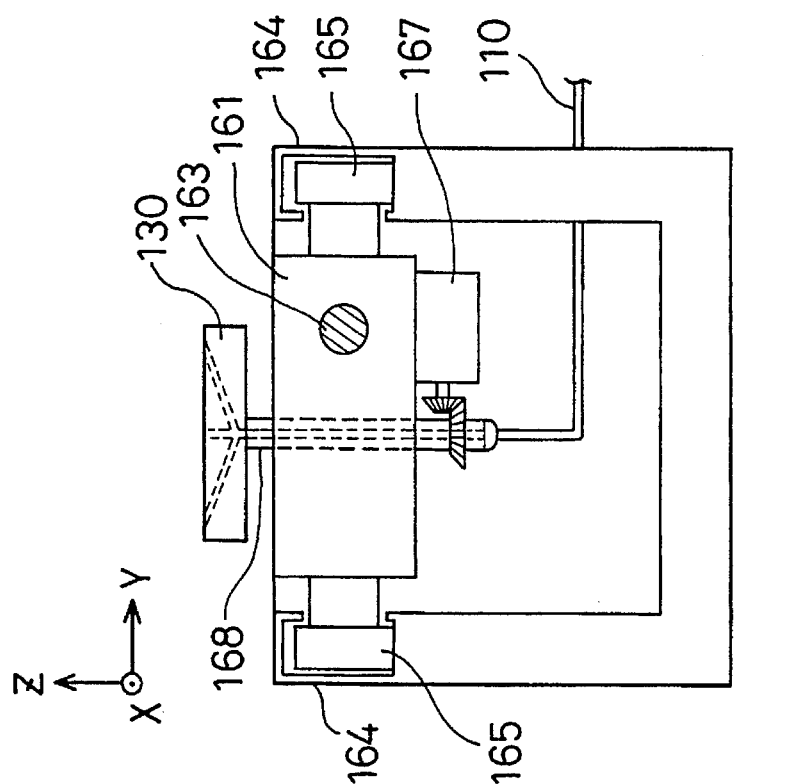
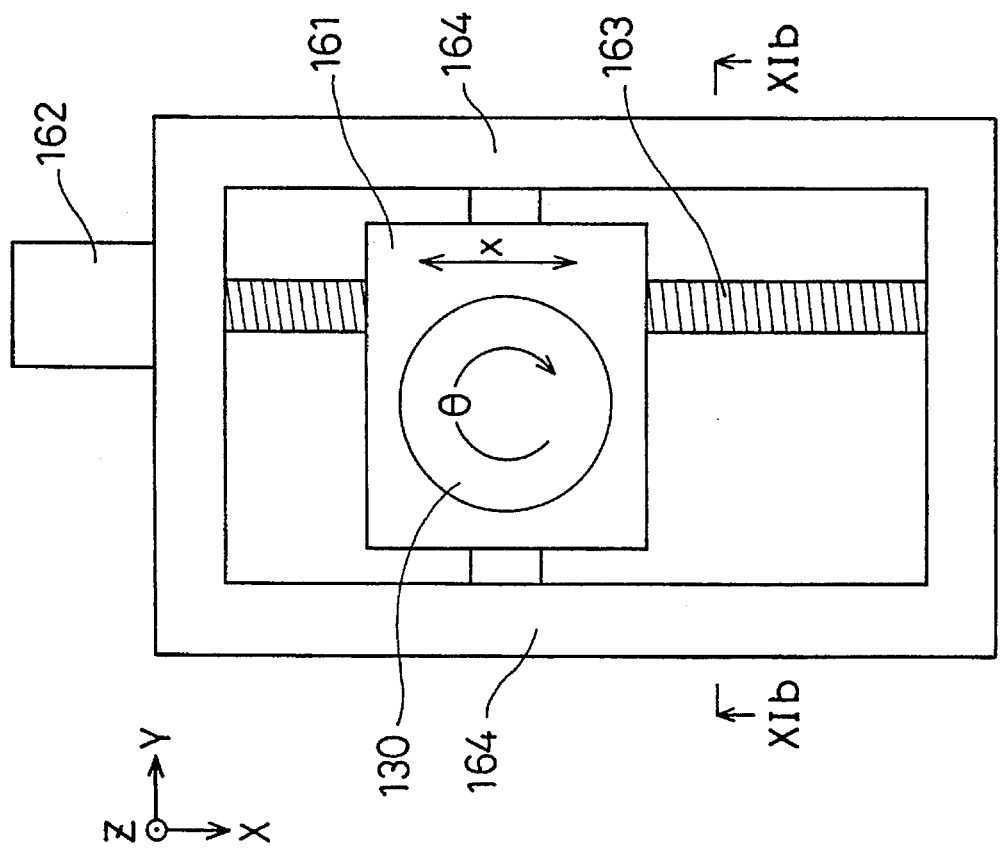
Fig. 11 (a)
Fig. 11 (b)

APPARATUS AND METHOD FOR ELECTRICAL MEASUREMENT OF SEMICONDUCTOR WAFERS

BACKGROUND OF THE INVENTION

1. Field of the Invention

The present invention relates to an apparatus method for electrically measuring properties of a semi-conductor wafer without contaminating the semi-conductor wafer.

2. Description of the Related Art

Measuring the properties of semi-conductor wafers is a procedure carried out generally for the purpose of inspecting the quality of the semi-conductor wafers. Electrical measurements, such as C-V measurement and C-t measurement, are typically applied to determine the properties of semi-conductor wafers.

A C-V measurement apparatus disclosed in U.S. Pat. No. 5,233,291 is one type of conventional apparatus used for such electrical measurement of semi-conductor wafers. This apparatus measures properties of semi-conductor wafers according to the C-V measurement process. Structure and operations of this apparatus are described below with reference to FIG. 1 which is a schematic showing a conventional C-V measurement apparatus used for electrical measurement of semi-conductor wafers.

As illustrated in FIG. 1, the apparatus includes a fixed bench 1, a piezoelectric actuator 2 disposed below the fixed bench 1, and a base 3 further disposed below the piezoelectric actuator 2. A prism 4 arranged on a bottom face of the base 3 includes two prism elements of truncated cone shape, whose bases are opposed to and in contact with each other. A laser source 5 like GaAlAs laser is fixed on one inclined face of the base 3 whereas a photosensor 6 like a photo diode is fixed on the other inclined face of the base 3.

A metal stage 7, which is composed of a metal, preferably stainless steel, and used for supporting a semi-conductor wafer 20, is mounted on a fixed table 9 disposed below the prism 4. A bottom face 4a of the prism 4 is arranged to be parallel to an XY plane, which is parallel to the surface of the metal stage 7. The surface of the semi-conductor wafer 20 mounted on the metal stage 7 is thus substantially parallel to the bottom face 4a of the prism 4.

Through holes 7a and 9a are formed in the metal stage 7 and the table 9, respectively, and connect with an oil rotary vacuum pump 8 via a pipe 10. This means that the through holes 7a and 9a and the pipe 10 form a vacuum line. Operation of the oil rotary vacuum pump 8 allows the semi-conductor wafer 20 mounted on the metal stage 7 to be sucked onto the metal stage 7.

A ring electrode 15 is fixed to the bottom face 4a of the prism 4. An underside of the ring electrode 15 is apart by a gap G from the surface of the semi-conductor wafer 20.

As described in detail in the aforesaid U.S. Pat. No. 5,233,291, the C-V measurement apparatus measures the gap G by utilizing the tunnel effect of a laser beam totally-reflected at the bottom face 4a of the prism 4 in geometric optical total reflections. In the tunnel effect, when there is a sufficiently short distance between the bottom face 4a of the prism 4 and the surface of the semi-conductor wafer 20, part of a laser beam leaks to the air gap between the prism 4 and the semi-conductor wafer 20.

The piezoelectric actuator 2 is connected to a Z-directional position control unit 11. The piezoelectric actuator 2 receives a voltage applied from the Z-directional position control unit 11 and shifts the base 3 in the Z or vertical direction.

The photosensor 6 is connected with an actinometer 12 while the electrode 15 and the metal stage 7 are connected to an impedance meter 13 which measures a combination of capacitance between the electrode 15 and the metal stage 7.

The Z-directional position control unit 11, the actinometer 12, and the impedance meter 13 are connected to a host controller 14. The host controller 14 is, for example, a personal computer which controls the whole measurement apparatus and executes processing of data obtained.

The C-V measurement apparatus thus constructed sets the gap G between the electrode 15 and the semi-conductor wafer 20 mounted on the metal stage 7 equal to a predetermined value by means of the Z-directional position control unit 11 and the actinometer 12, and executes the C-V measurement by means of the impedance meter 13, while the electrode 15 and the metal stage 7 function as measurement electrodes.

The C-V measurement apparatus can perform the C-V measurement without requiring formation of any additional electrodes on an insulating film of the semi-conductor wafer 20 as a result becomes.

In the conventional C-V measurement apparatus, the semi-conductor wafer 20 is mounted on the metal stage 7, so that the rear face of the semi-conductor wafer 20 is in direct contact with the surface of the metal stage 7 and thereby contaminated with the metal included in the metal stage 7, such as Ni (nickel), Cr (chromium), or Fe (iron).

If the metal-contaminated semi-conductor wafer is placed with other non-contaminated semi-conductor wafers in a sealed vessel in a heating process, metal atoms attached to the rear face of the metal-contaminated semi-conductor wafer diffuse into the atmosphere in the sealed vessel. These diffused metal atoms then adhere to an opposite face Of the contaminated semi-conductor wafer and surfaces of the other non-contaminated semi-conductor wafers, resulting in undesirable propagation of metal contamination.

Once the rear face of a semi-conductor wafer is contaminated with metal, the semi-conductor wafer cannot be processed further to manufacture semi-conductor products. Because of this, dummy semi-conductor wafers rather than real products of semi-conductor wafers are utilized for electrical measurement with the conventional apparatus.

When electrical measurement of various properties of semi-conductor wafers is required at such step of the manufacturing process, a large number of dummy semi-conductor wafers should be prepared, which significantly increases cost.

SUMMARY OF THE INVENTION

One object of this invention is to provide a method of electrically measuring properties of a semi-conductor wafer without contaminating the rear face of the semi-conductor wafer with any metals.

Another object of this invention is to provide an apparatus to realize electrical measurement of a semi-conductor wafer without contaminating the rear face of the semi-conductor wafer with any metals.

The above and other related objects are realized by an apparatus utilized for electrically measuring properties of a semi-conductor wafer, which apparatus comprises a stage on which said semi-conductor wafer is to be mounted, with the stage being used as a measurement electrode in the measuring process. The stage comprises a conductive base and an anti-metal contamination film formed on the conductive base. An anti-metal contamination film is utilized to come into contact with the semi-conductor wafer so as to protect the semi-conductor wafer from contamination with metal.

In the structure of this invention, the rear face of the semi-conductor wafer mounted on the stage is in direct contact with the anti-metal contamination film rather than contacting the metal surface. This effectively protects the rear face of the semi-conductor wafer from being contaminated with metal.

According to a preferable application, the anti-metal contamination film comprises a film whose material is selected from the group consisting of semi-conductor passivation material, semi-conductor oxide, semi-conductor nitride, semi-conductor carbide and polytetrafluoroethylene. The conductive base is made of semi-conductor material having a resistivity of not larger than 1 $\Omega$cm. None of the materials for the anti-metal contamination film contains simple substances of any metals or harmful atoms for the semi-conductor wafer. Accordingly, the rear face of the semi-conductor wafer is not contaminated with any metal atoms or any harmful atoms.

The apparatus of this invention preferably includes an electrode arranged above the semi-conductor wafer that is mounted on the stage, to be aparted by a predetermined distance from the semi-conductor wafer, where the electrode is used as another measurement electrode. The apparatus has another measurement electrode disposed above the semi-conductor wafer by a predetermined distance and realizes electrical measurements without forming any additional electrode on the semi-conductor wafer, so that a time-consuming step of electrode formation is not required.

According to another preferable application, the apparatus also includes a dry vacuum pump for sucking the semi-conductor wafer onto the stage. The dry vacuum pump effectively decreases diffusion of oil vapor through the vacuum line toward the semi-conductor wafer and thereby reduces the number of ion impurities included in the oil vapor adhering to the rear face of the semi-conductor wafer.

Preferably, the apparatus includes a trap disposed in the middle of a vacuum line, which runs from the dry vacuum pump for suction holding of the semi-conductor wafer. The trap arranged in the vacuum line further prevents the diffusion of oil vapor through the vacuum line toward the semi-conductor wafer and physically or chemically reduces the number of ion impurities adhering to the rear face of the semi-conductor wafer.

The invention is also directed to an apparatus applied for electrically measuring properties of a semi-conductor wafer comprising a stage on which said semi-conductor wafer is to be mounted. The stage is used as a measurement electrode in the measuring. The stage comprises a semi-conductor element constructed of semi-conductor material having a resistivity not greater than 1 $\Omega$cm. The semi-conductor element is adaptable to come into contact with the semi-conductor wafer.

In this structure of the invention, the rear face of the semi-conductor wafer mounted on the stage is in direct contact not with a metal surface but with the anti-metal contamination semi-conductor which does not contain any simple substances of any metals and thereby protects the rear face of the semi-conductor wafer from contamination with metal. The semi-conductor, which is generally used as a primary constituent of the anti-metal contamination semi-conductor wafer, does not have any adverse effect on the semi-conductor wafer nor does it contaminate the rear face of the semi-conductor wafer. The semi-conductor having a resistivity of not greater than 1 $\Omega$cm does not cause any problems in utilizing the stage as a measurement electrode.

The invention is further directed to a method of electrically measuring properties of a semi-conductor wafer, the method including the steps of: (a) providing a stage which includes a conductive base and an anti-metal contamination film that is free from simple substances of metals; (b) mounting the semi-conductor wafer onto the anti-metal contamination film of the stage; and (c) electrically measuring the properties of the semi-conductor wafer by using the stage as a measurement electrode.

The invention is yet further directed to a method of electrically measuring properties of a semi-conductor wafer, the method including the steps of: (a) providing a stage including a semi-conductor material element made of semi-conductor having a resistivity of not larger than 1 $\Omega$cm; (b) mounting the semi-conductor wafer onto the semi-conductor element of the stage; and (c) electrically measuring the properties of the semi-conductor wafer by using the stage as a measurement electrode.

These and other objects, features, aspects, and advantages of the present invention will become more apparent from the following detailed description of the preferred embodiment considered with the accompanying drawings.

BRIEF DESCRIPTION OF THE DRAWINGS

FIGS. 6(a) and 6(b) are, respectively, a structure between the electrode 115 and the stage 130 shown in FIG. 2, and an electrically equivalent circuit corresponding to the structure of FIG. 6(a);

FIGS. 11(a) and 11(b) are top and side views, respectively, of the X-$\theta$ table 160 shown in FIG. 2;

DETAILED DESCRIPTION OF THE PREFERRED EMBODIMENTS

Figure 2:
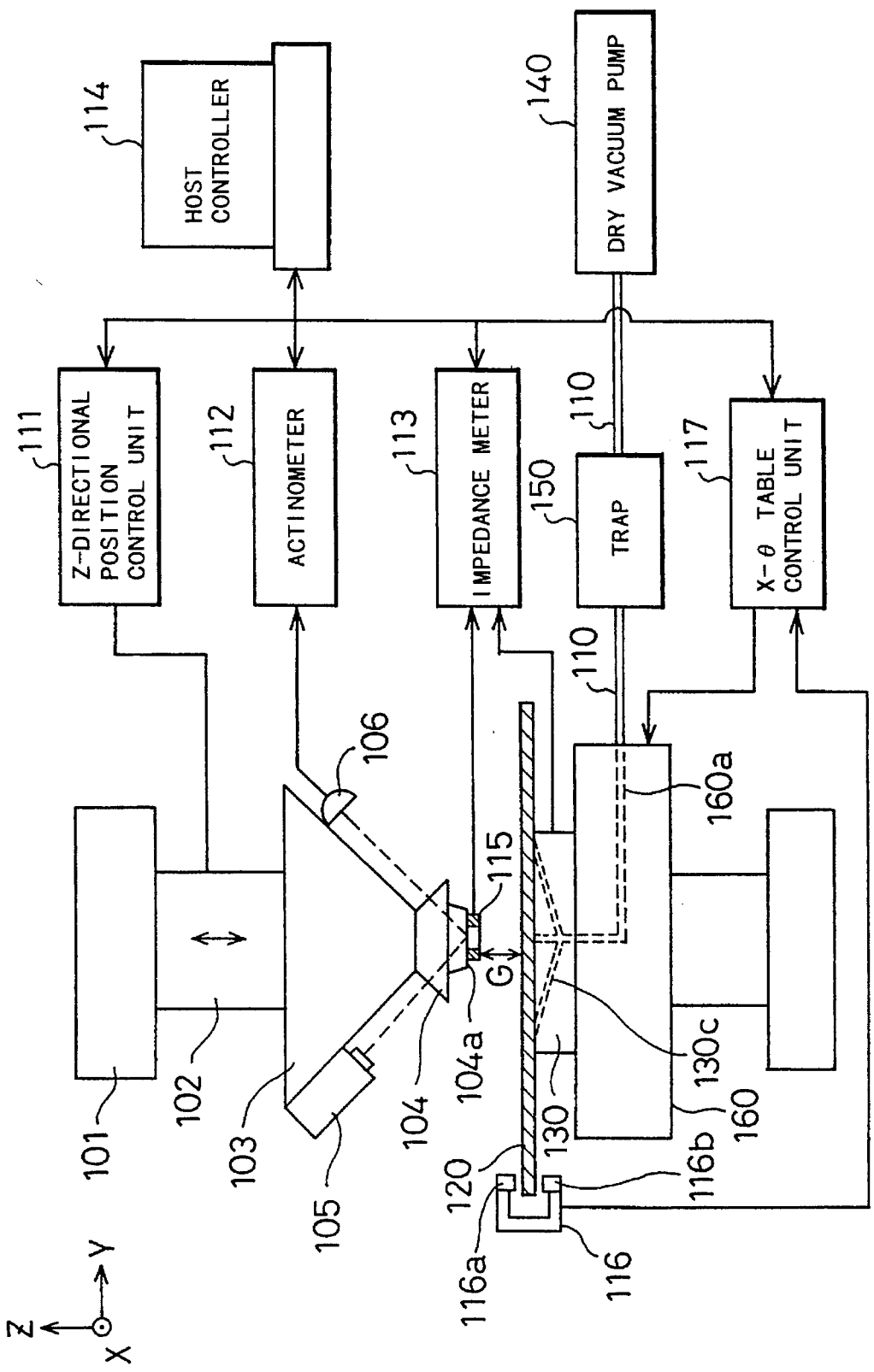
FIG. 2 is a schematic illustrating a C-V measurement apparatus applied for electrical measurement of semi-conductor wafers, embodying the instant invention.

FIG. 2 is a schematic illustrating a C-V measurement apparatus and embodying the instant invention applied for electrical measurement of semi-conductor wafers.

As illustrated in FIG. 2, the apparatus includes a fixed bench 101, a piezoelectric actuator 102 disposed below the fixed bench 101, and a base 103 further disposed below the piezoelectric actuator 102. A prism 104 arranged on a bottom face of the base 103 includes two prism elements of truncated cone shape, whose bases are opposed to and in contact with each other. A laser source 105 like GaAlAs laser is fixed on one inclined face of the base 103 whereas a photosensor 106 like a photo diode is fixed on the other inclined face of the base 103.

A stage 130 for supporting a semi-conductor wafer 120 is mounted on an X-θ table 160 disposed below the prism 104. The stage 130 includes a metal base and an anti-metal contamination film formed on the metal base as described later in detail. A bottom face 104a of the prism 104 is arranged to be parallel to an XY plane, which is in turn parallel to the surface of the stage 130. The surface of the semi-conductor wafer 120 mounted on the stage 130 is thus in turn parallel to the bottom face 104a of the prism 104.

Through holes 130c and 160a are respectively formed in the stage 130 and the X-θ table 160, and connect with a dry vacuum pump 140 via a pipe 110 which forms part of the vacuum line and is provided with a trap 150 in the middle thereof. Operation of the dry vacuum pump 140 allows the semi-conductor wafer 120 mounted on the stage 130 to be sucked onto the stage 130.

A ring electrode 115 is fixed to the bottom face 104a of the prism 104, with the underside of the ring electrode 115 being spaced by a gap G from the upper surface of the semi-conductor wafer 120.

The C-V measurement apparatus of this invention measures the gap G by utilizing the tunnel effect of a laser beam totally reflected at the bottom face 104a of the prism 104 under geometric optical total reflection coditions. In the tunnel effect, when there is a sufficiently short distance between the bottom face 104a of the prism 104 and the surface of the semi-conductor wafer 120, part of a laser beam leaks to an air gap between the prism 104 and the semi-conductor wafer 120.

An orientation flat position detector 116 is arranged on one end of the semi-conductor wafer 120. The orientation flat position detector 116 includes an emission unit 116a disposed above the semi-conductor wafer 120 and a detector unit 116b disposed below the semi-conductor wafer 120 for detecting the position of an orientation flat of the semi-conductor wafer 120.

The piezoelectric actuator 102 is connected to a Z-directional position control unit 111. The piezoelectric actuator 102 receives a voltage applied from the Z-directional position control unit 111 and shifts the base 103 in the Z direction or vertically.

The photosensor 106 is connected with an actinometer 112, while both the electrode 115 and the stage 130 are connected to an impedance meter 113. The impedance meter 113 measures a combination of capacitance between the electrode 115 and the stage 130.

The orientation flat position detector 116 and the X-θ table 160 connect with an X-θ table control unit 117, which controls the X-θ table 160 based on the position of an orientation flat detected by the orientation flat position detector 116 and on instructions given from a host controller 114.

The Z-directional position control unit 111, the actinometer 112, the impedance meter 113, and the X-θ table control unit 117 are all connected to the host controller 114. The host controller 114, for example, a personal computer, controls the whole measurement apparatus and executes processing of data obtained.

The C-V measurement apparatus thus constructed shifts the semi-conductor wafer 120 mounted on the stage 130 in the X-θ direction (the θ direction will be described later) to adjust the position of the semi-conductor wafer 120 with respect to the electrode 115 by means of the orientation flat position detector 116, the X-θ table 160, and the X-θ table control unit 117. The C-V measurement apparatus then sets the gap G between the electrode 115 and the semi-conductor wafer 120 equal to a predetermined value by means of the Z-directional position control unit 111 and the actinometer 112, and executes the C-V measurement by means of the impedance meter 113, while using the electrode 115 and the stage 130 as measurement electrodes.

Figure 3:
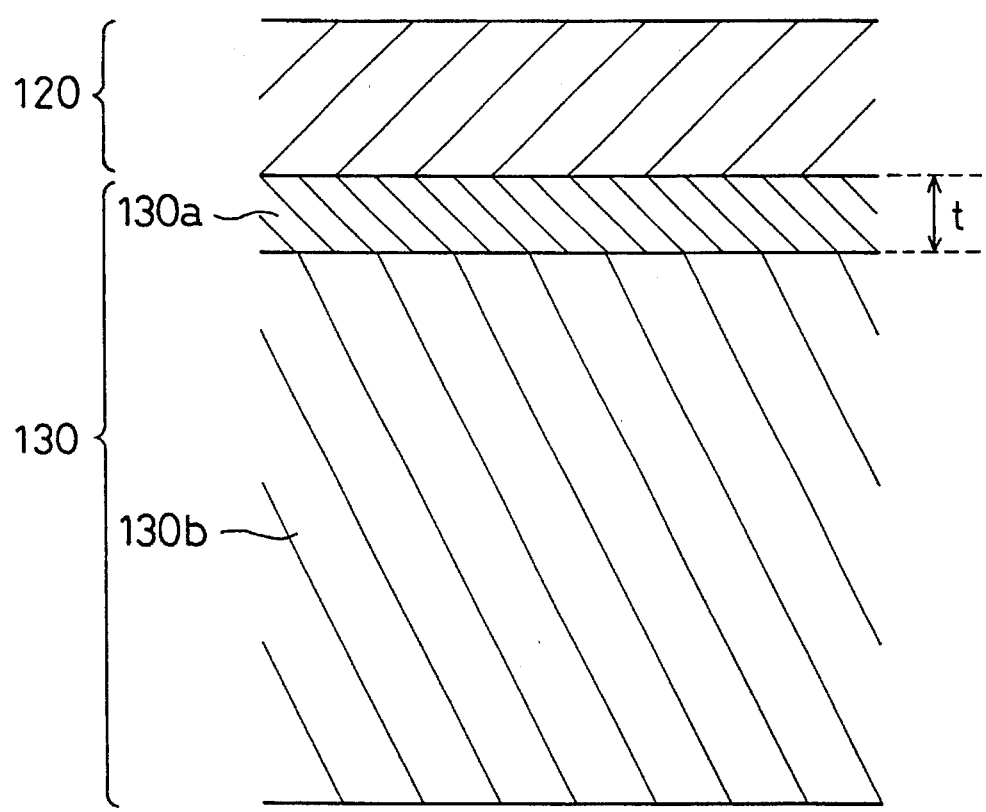
FIG. 3 is a partial cross section of the stage 130 shown in FIG. 2.

Detailed structure of the stage 130 is described according to FIG. 3, which is a a partial cross section of the stage 130 shown in FIG. 2. As illustrated in FIG. 3, the stage 130 includes a metal base 130b, such as stainless steel, and an anti-metal contamination film 130a formed on the metal base 130b.

The anti-metal contamination film 130a is made of a metal-free material such as a semi-conductor material, semi-conductor oxide, semi-conductor nitride, semi-conductor carbide, and polytetrafluoroethylene. Examples of the semi-conductor material include silicon (Si), germanium (Ge), gallium arsenide (GaAs), and indium phosphide (InP). Silicon dioxide ($SiO_2$), silicon nitride ($Si_3N_4$), and silicon carbide (SIC) are usable as the semi-conductor oxide, the semi-conductor nitride, and the semi-conductor carbide, respectively.

The above structure of the stage 130 allows the rear face of the semi-conductor wafer 120 that is mounted on the stage 130 not to contact the metal surface. Instead wafer 120 contacts the anti-metal contamination film 130a. As described above, the anti-metal contamination film 130a is made of a semi-conductor material, semi-conductor oxide, semi-conductor nitride, semi-conductor carbide or polytetrafluoroethylene, none of which contains simple substances of any metals, so that the rear face of the semi-conductor wafer 120 will not be contaminated with any metal atoms. Further, since none of the materials for the anti-metal contamination film includes atoms that are harmful for the semi-conductor wafer 120, the rear face of the semi-conductor wafer 120 will not be contaminated with any harmful atoms.

Figure 4:
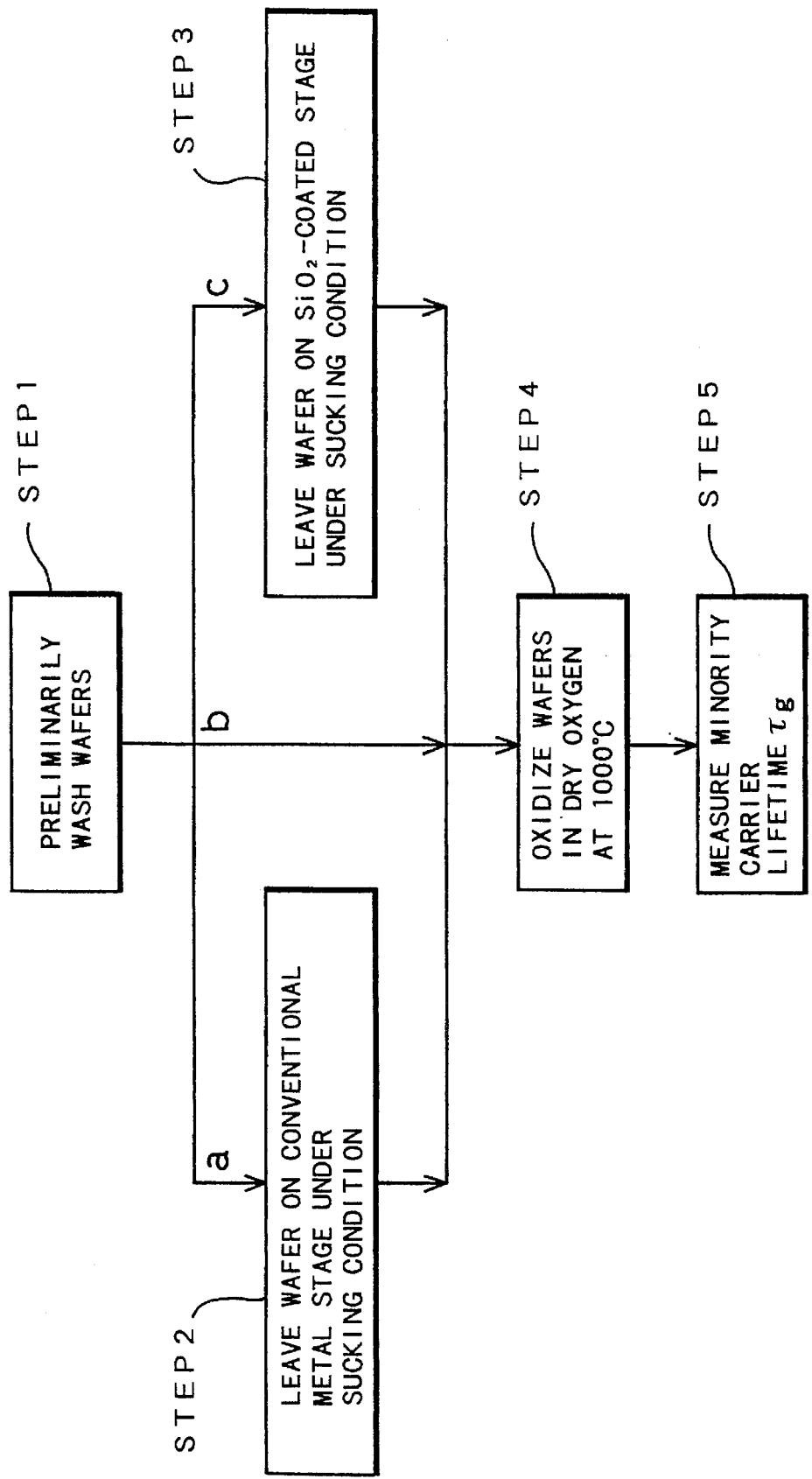
FIG. 4 is a flowchart showing an experimental routine of comparing degrees of metal contamination on the rear face between semi-conductor wafers mounted on a conventional metal stage and the stage 130 of the embodiment illustrated in FIG. 2.

An experiment was conducted to verify that the stage 130 constructed as above protects the rear face of the semi-conductor wafer 120 from contamination with metal. FIG. 4 is a flowchart showing an experimental routine for comparing degrees of metal contamination on the rear face between semi-conductor wafers mounted on a conventional metal stage and the stage 130 of the embodiment.

Three semi-conductor wafers not designated in the drawing but herein referred to as 'a', 'b', and 'c', were washed preliminarily (step 1). The wafer 'a' was mounted and sucked onto a conventional metal stage and left under the sucking condition for one hour (step 2), while the wafer 'c' was mounted and sucked onto the stage 130 of the embodiment and left under the sucking condition for one hour (step 3), where the anti-metal contamination film 130a of the stage 130 was made of silicon dioxide ($SiO_2$). Both the wafers 'a' and 'c' that were left under the respective sucking conditions for one hour were oxidized in an atmosphere of dried oxygen at a temperature of 1,000° C., whereas the wafer 'b' was oxidized in the atmosphere of dried oxygen at a temperature of 1,000° C. immediately after the preliminary washing (step 4).

A minority carrier lifetime $\tau_g$ was measured according to the known C-t method for the oxidized wafers 'a', 'b', and 'c' (step 5). It is generally known that the minority carrier lifetime $\tau_g$ is largely correlated to the degree of metal contamination. The greater the amount of metal contamination is, the shorter the minority carrier lifetime $\tau_g$ is. In the experiment, the degree of metal contamination was evaluated by the minority carrier lifetime $\tau_g$.

Figure 5:
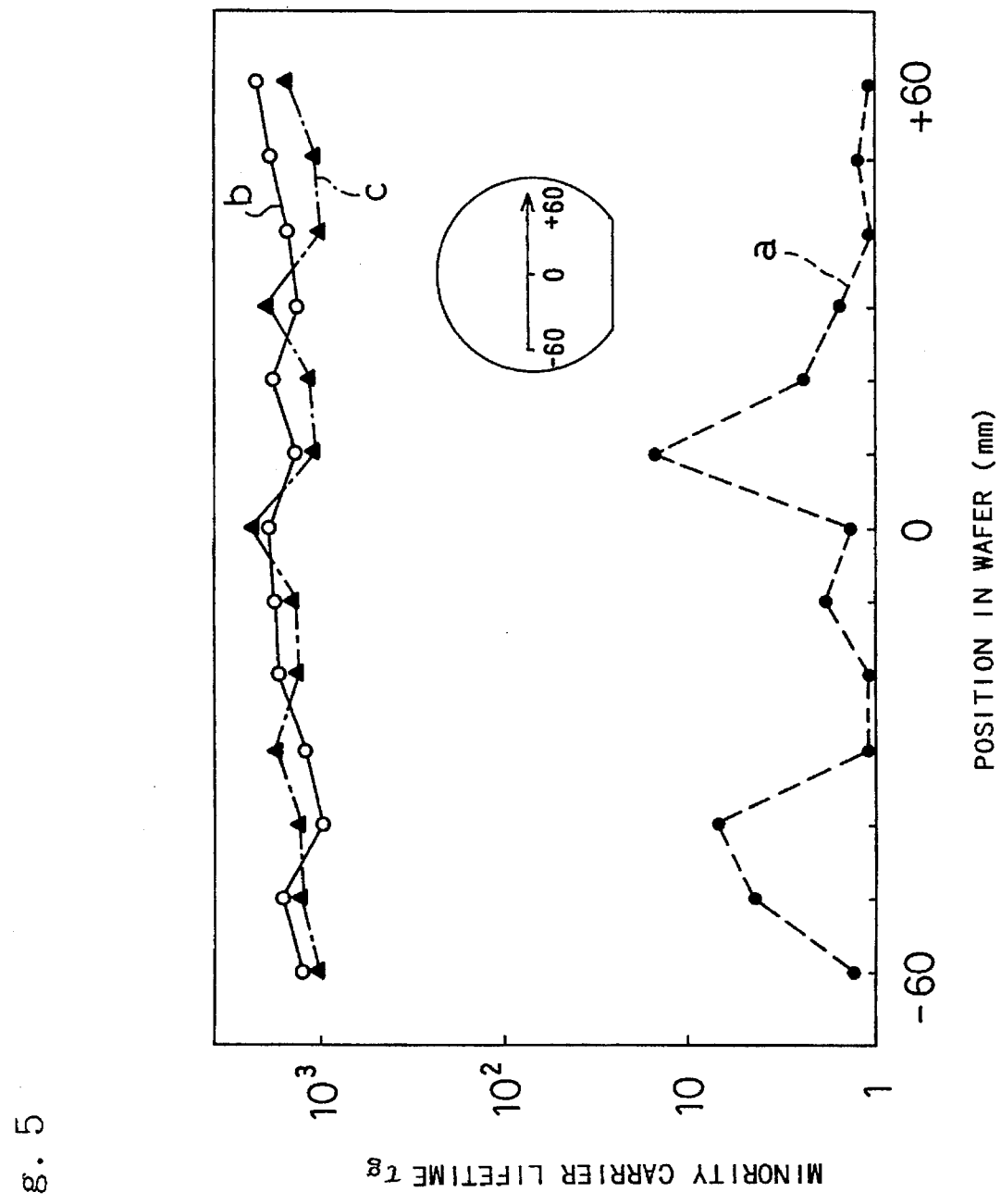
FIG. 5 are characteristic curves representing variations in minority carrier lifetime at respective positions in the wafers 'a', 'b', and 'c'.

FIG. 5 shows characteristic curves representing variations in minority carrier lifetime at respective positions in the wafers 'a', 'b', and 'c'. In the graph of FIG. 5, the position in each wafer relative to the origin 'O' or center of the wafer is plotted as the abscissa and the minority carrier lifetime as the ordinate. Numerals (−60, 0, +60) in a plan view of a wafer shown in FIG. 5 correspond to the values on the abscissa. Characteristic curves 'a', 'b', and 'c' in FIG. 5 represent characteristics of the respective wafers 'a', 'b', and 'c'.

As clearly shown in FIG. 5, the wafer 'a' mounted and sucked onto the conventional metal stage has extremely short minority carrier lifetimes $\tau_g$, which represent significant contamination with metal. On the other hand, the wafer 'c' mounted and sucked onto the stage of the embodiment of FIG. 2 herein (that is, the stage coated with silicon dioxide as the anti-metal contamination film), on the other hand, has minority carrier lifetimes $\tau_g$ approximately equivalent to those of the wafer 'b' which was not mounted on either of the two stages and has thereby no contamination with metal. This means that the wafer 'c' was substantially not contaminated with metal.

All the materials for the anti-metal contamination film mentioned above are dielectric except the semi-conductor material. The semi-conductor material with extremely high resistivity is also a kind of insulating film. When the stage 130 works as a measurement electrode, the rear face of the semi-conductor wafer 120 is in contact with the metal base 130b actually functioning as the electrode not directly but via an insulating film. Even with the metal base 130b functioning as the electrode and even when the rear face of the semi-conductor wafer 120 is not in direct contact with base 130b, no problems arise insofar as the ability of the stage 130 to function as intended. FIGS. 6(a) and 6(b) illustrate a structure (FIG. 6(a)) between the electrode 115 and the stage 130 shown in FIG. 2 and an electrically equivalent circuit (FIG. 6(b)) corresponding thereto. When the semi-conductor wafer 120 includes a silicon substrate 120b and a silicon dioxide film 120a formed on the substrate 120b as shown in FIG. 6(a), the corresponding electrically equivalent circuit is given as FIG. 6(b) by considering high-frequency capacity coupling between the electrode 115 and the stage 130.

The electrically equivalent circuit is expressed as series connection of a capacitance Cair of the air between the electrode 115 and the semi-conductor wafer 120, a capacitance Cox of the silicon dioxide film 120a, a capacitance Cd of a depletion layer formed in the silicon substrate 120b, and a capacitance C of the dielectric anti-metal contamination film 130a, where the respective capacitances represent values per unit area.

When the anti-metal contamination film 130a is of small thickness and the capacitance C is sufficiently greater than the other capacitances Cair, Cox, and Cd (that is, when C>>Cair, Cox, and Cd), the capacitance C is substantially negligible in the combination of capacitance of the series connection. That is why no problems arise in functions of the stage 130 even if the rear face of the semi-conductor wafer 120 is not in direct contact with the metal base 130b which is connected as an electrode in the apparatus of FIG. 2.

The thickness of the anti-metal contamination film 130a is determined in the following manner. For example, in the case of a 6-inch semi-conductor wafer 120 (having the area of approximately 7.5×7.5×3.14 $cm^2$) being treated, the capacitance C per unit area of the anti-metal contamination film 130a is required to be not less than 0.57 nF, so that the capacitance of that portion of the anti-metal contamination film 130a which has contact with the semi-conductor wafer 120 is not less than 100 nF.

The thickness t of the anti-metal contamination film 130a shown in FIG. 3 is expressed as:

$$t = \epsilon_s \times \epsilon_o / C \qquad (1)$$

where $\epsilon_s$ and $\epsilon_o$ respectively relative permittivity of the anti-metal contamination film 130a and permittivity of vacuum having the value of $8.85 \times 10^{-14}$ F/cm.

Suppose that the anti-metal contamination film 130a is composed of silicon (Si), that is, polysilicon (Poly-Si) having the relative permittivity $\epsilon_s$ of approximately 11.8. Then using Equation (1) the thickness t of the anti-metal contamination film 130a is not greater than 18 micrometer so that the capacitance C per unit area of the anti-metal contamination film 130a is not less than 0.57 nF.

If the anti-metal contamination film 130a is composed of silicon dioxide ($SiO_2$) having the relative permittivity $\epsilon_s$ of approximately 3.9, then according to Equation (1) the thickness t of the anti-metal contamination film 130a is no greater than 6 micrometer.

If the anti-metal contamination film 130a is composed of silicon nitride ($Si_3N_4$) having the relative permittivity $\epsilon_s$ of approximately 7.5, then according to Equation (1) the thickness t of the anti-metal contamination film 130a is no greater than 11.5 micrometer.

If the anti-metal contamination film 130a is composed of polytetrafluoroethylene having the relative permittivity $\epsilon_s$ of approximately 2.1, then according to Equation (1) the thickness t of the anti-metal contamination film 130a is no greater than 3.3 micrometer.

Figure 1:
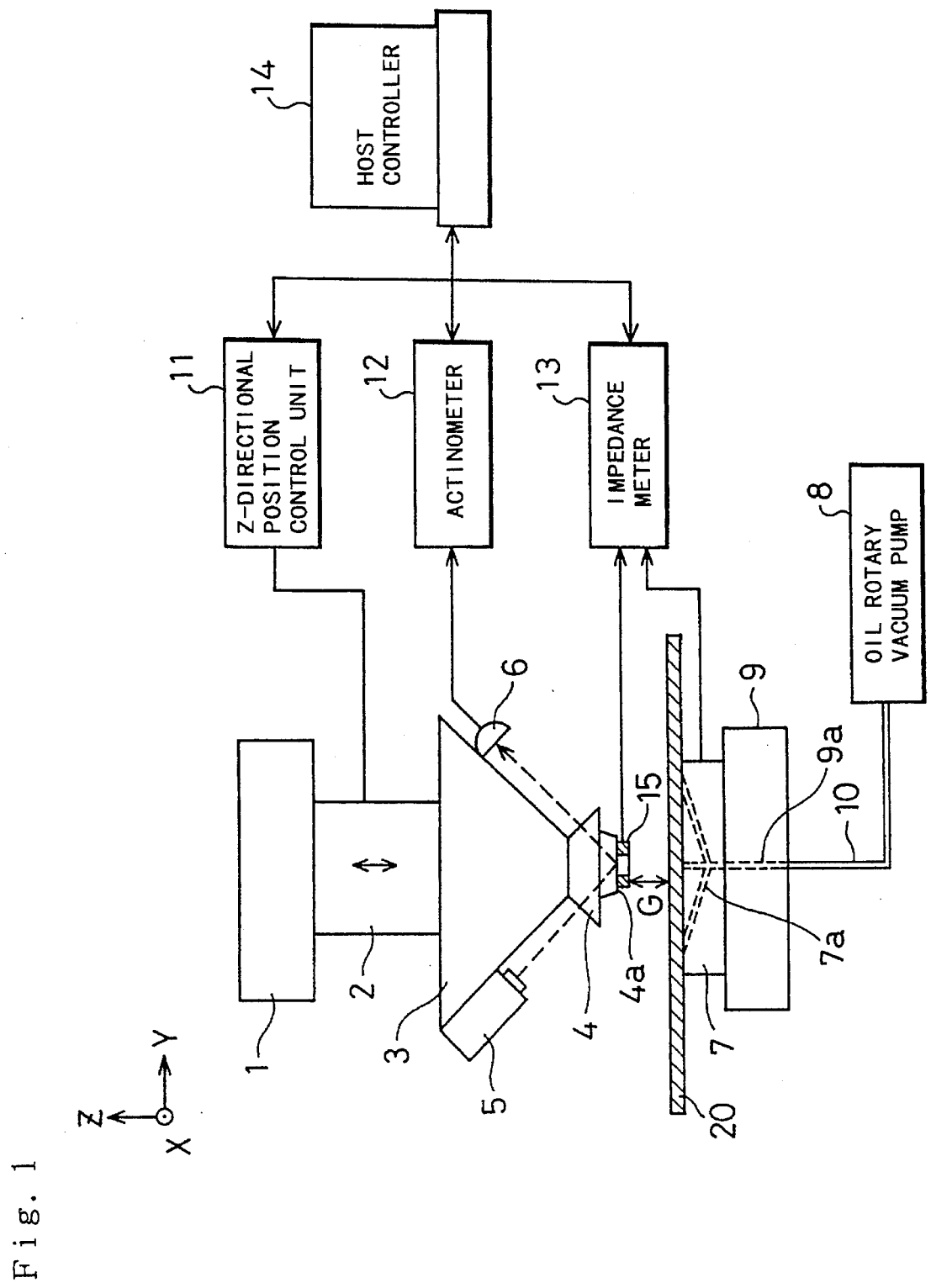
FIG. 1 is a schematic showing a conventional C-V measurement apparatus applied for electrical measurement of semi-conductor wafers, as described above.

As described previously, the semi-conductor wafer 120 mounted on the stage 130 is held thereon by suction. In the conventional apparatus shown in FIG. 1, the oil rotary vacuum pump 8 is used for generating suction to hold a semi-conductor wafer. Oil used in the oil rotary vacuum pump 8 is diffused as vapor through the vacuum line toward the semi-conductor wafer, and ions included in the oil (for example, $Na^+$ and $K^+$) adhere as contaminant ions to the rear face of the semi-conductor wafer, which is thereby contaminated with ion impurities.

The structure of the embodiment utilizes the dry vacuum pump 140 instead of such an oil rotary vacuum pump. The dry vacuum pump represents any oil-free vacuum pump which can maintain the air tightness without the aid of oil or any liquid. The dry vacuum pump 140 effectively decreases the diffusion of oil vapor toward the semi-conductor wafer and thereby reduces the number of ion impurities adhering to the rear face of the semi-conductor wafer.

Typical examples of the dry vacuum pump 140 include a diaphragm type dry vacuum pump and a bellows type dry vacuum pump.

Figure 7A:
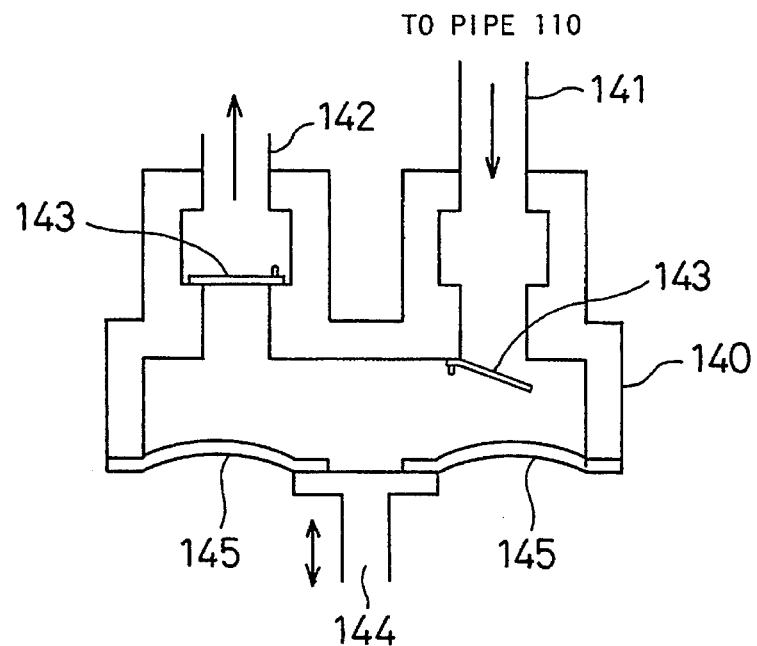
FIGS. 7(a) and 7(b) are schematics illustrating examples of the dry vacuum pump shown in FIG. 2.
Figure 7B:
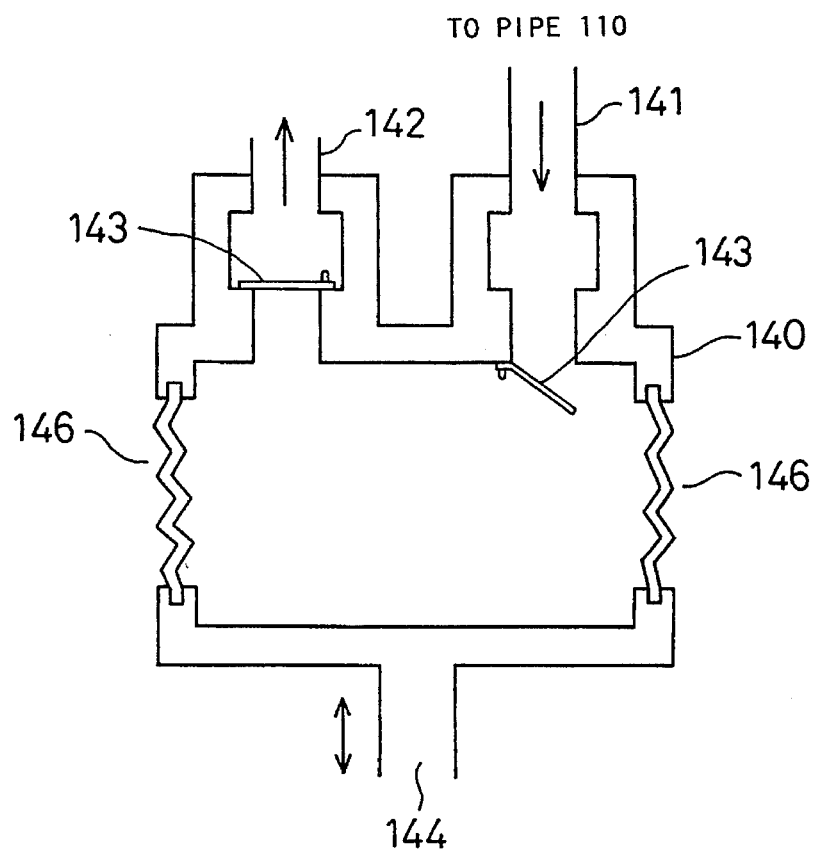

FIGS. 7(a) and 7(b) are cross sectional views schematically illustrating examples of the dry vacuum pump 140 shown in FIG. 2. That is, FIG. 7(a) illustrates a diaphragm type dry vacuum pump and FIG. 7(b) illustrates a bellows type dry vacuum pump.

The diaphragm type dry vacuum pump of FIG. 7(a) executes evacuation by taking advantage of the reciprocating motion of a diaphragm (thin rubber film) 145, and the bellows type dry vacuum pump of FIG. 7(b) executes evacuation by taking advantage of expansion and contraction of a bellows 146. In either vacuum pump, a piston 144 reciprocates to alternately open and close a valve 143, which sucks out the air through an air inlet 141 connecting with the pipe 110 and discharges the air through an air outlet 142 to the atmosphere.

In order to more effectively prevent oil vapor from diffusing through the vacuum line toward the semi-conductor wafer, the structure of the embodiment further includes the oil trap 150 disposed in the middle of the pipe 110 constituting part of the vacuum line. The trap physically or chemically reduces the partial pressure of undesirable gas or vapor and prevents the flow or movement of such gas or vapor.

Figure 8A:
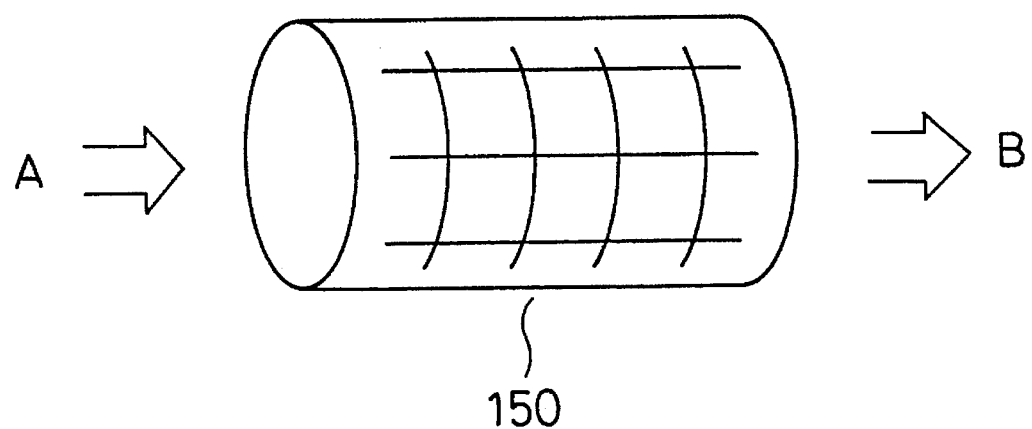
FIGS. 8(a) and 8(b) are perspectives in schematic form illustrating a concrete structure of the oil trap 150 shown in FIG. 2.
Figure 8B:
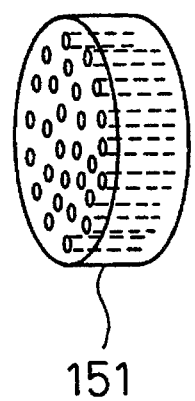

FIGS. 8(a) and 8(b) are perspective views schematically illustrating a concrete structure of the oil trap 150 shown in FIG. 2. The oil trap 150 is cylinder in shape as shown in FIG. 8(a) and arranged to have a side A toward the dry vacuum pump 140 and a side B toward the semi-conductor wafer 120. The oil trap 150 consists of an array of porous filters 151 (the diameter of each pore is approximately 0.05 micrometer) as shown in FIG. 8(b). One or a plurality of cartridges filled with an adsorbent such as active carbon may be used in place of the filters 151.

The oil trap 150 disposed in the middle of the vacuum line effectively prevents oil vapor from diffusing through the vacuum line toward the semi-conductor wafer, thereby further reducing the number of contaminant ions adhering to the rear face of the semi-conductor wafer and protecting the rear face of the semi-conductor wafer from contamination of the ion impurities.

An experiment was conducted to verify that the oil trap 150 constructed as above protects the rear face of the semi-conductor wafer 120 from contamination with ion impurities. Three semi-conductor wafers 'd', 'e', and 'f' were used for this experiment. The wafer 'd' was sucked onto the stage by means of a dry vacuum pump without an oil trap in the middle of the vacuum line, while the wafer 'f' was sucked onto the stage by means of a dry vacuum pump with an oil trap in the middle of the vacuum line.

The known C-V measurement was then conducted for the wafers 'd' and 'f', and a quantity of electric charges $N_{fb}$ in the oxide film of each wafer was determined based on flat band voltages of the C-V characteristics thus obtained. In this experiment, the degree of contamination with ion impurities was evaluated by the quantity of electric charges $N_{fb}$ in the oxide film. Generally, as the amount of contamination with ion impurities increases, so does the quantity of electric charges in the oxide film. The quantity of electric charges in the oxide film was measured directly for the wafer 'e'.

Figure 9:
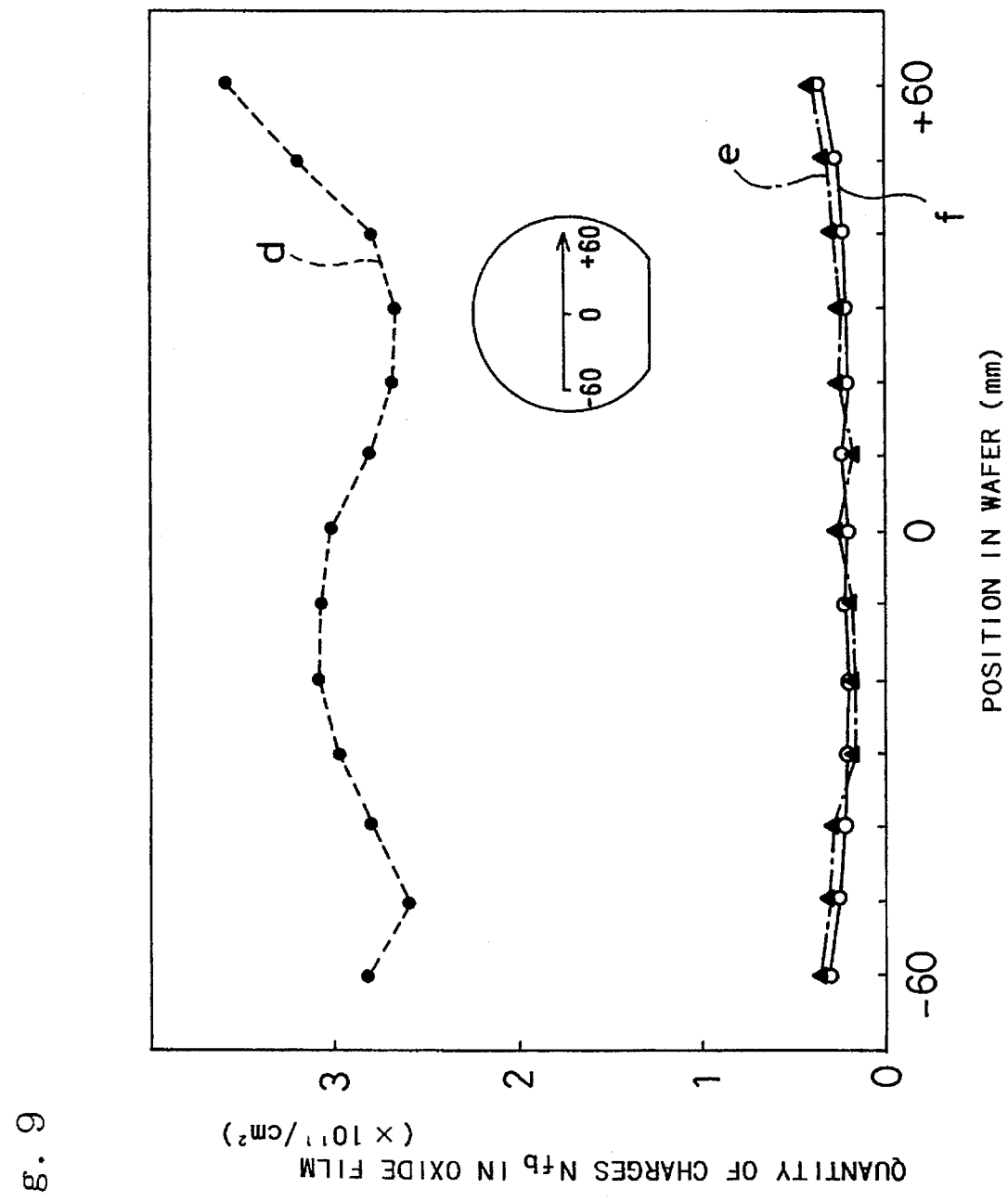
FIG. 9 are characteristic curves representing variations in quantity of electric charges in the oxide film at respective positions in the wafers 'a', 'b', and 'c'.

FIG. 9 shows characteristic curves representing variations in quantity of electric charges in the oxide film at respective positions in the wafers 'd', 'e', and 'f'. In the graph of FIG. 9, the position in each wafer relative to the origin 'O' or center of the wafer is plotted as abscissa and the quantity of electric charges in the oxide film as ordinate. Numerals (−60, 0, +60) in a plan view of a wafer shown in FIG. 9 correspond to the values on the abscissa. Characteristic curves 'd', 'e', and 'f' in FIG. 9 respectively represent characteristics of the wafers 'd', 'e', and 'f'.

As clearly shown in FIG. 9, the wafer 'd' sucked onto the stage by means of a dry vacuum pump without an oil trap has measurable quantities of electric charges $N_{fb}$ in the oxide film, which represent some contamination with ion impurities. The wafer 'f' sucked onto the stage by means of a dry vacuum pump with an oil trap, on the other hand, has quantities of electric charges $N_{fb}$ in the oxide film significantly smaller than those of the wafer 'd' and substantially equivalent to those of the wafer 'e'. This means that the wafer 'f' was substantially not contaminated with ion impurities.

As described above, the structure of the embodiment effectively prevents the rear face of the semi-conductor wafer 120 mounted on the stage 130 from being contaminated with metal and the rear face of the semi-conductor wafer 120 sucked onto the stage 130 from being contaminated with ion impurities. After measurement of electrical properties, the semi-conductor wafer 120 can be detached from the stage 130 and returned to the manufacturing process of semi-conductor products.

The structure of the embodiment allows real products of semi-conductor wafers to be used for electrical measurement. The embodiment does not require any dummy semi-conductor wafers and thereby effectively reduces the cost.

If a real product of a semi-conductor wafer is to be used for electrical measurement, a test pattern for the electrical measurement is formed on a part of the semi-conductor wafer. The test pattern is automatically formed through the manufacturing process by previously arranging a corresponding pattern at a desired position of a photo mask pattern.

Figure 10A:
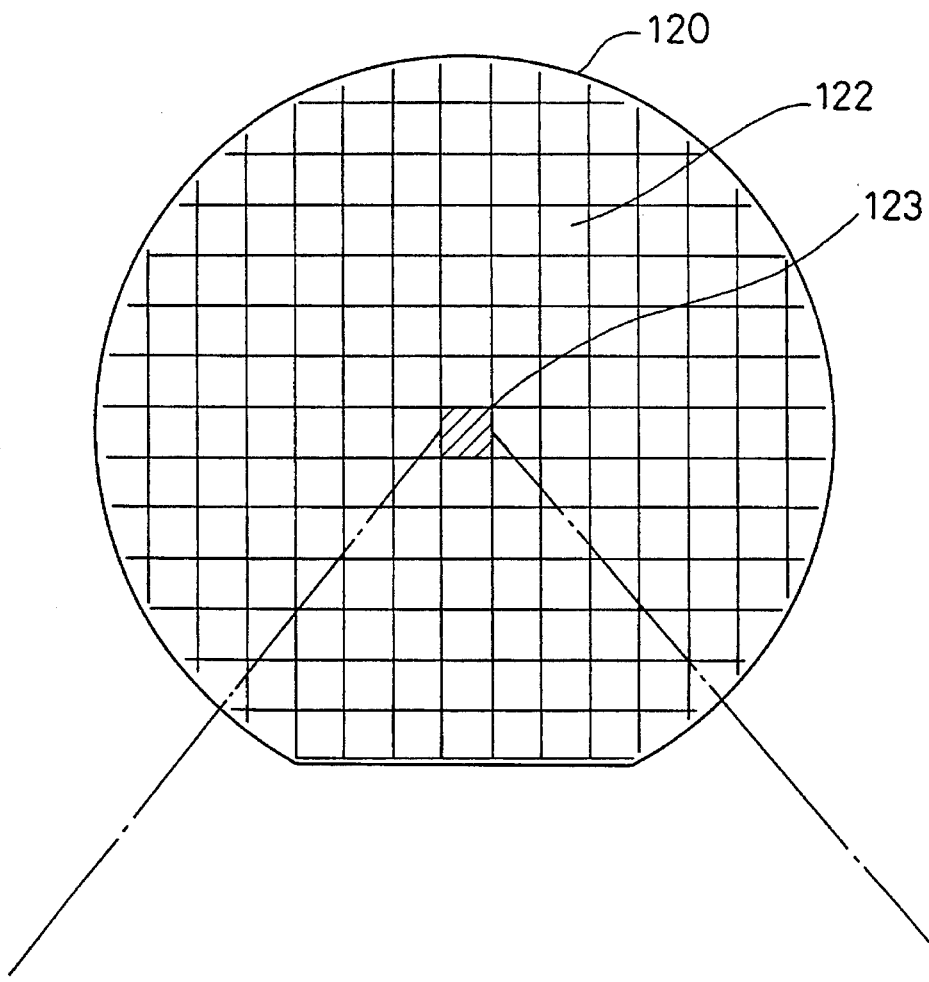
FIGS. 10(a) and 10(b are, respectively, a test pattern formed on a part of the semi-conductor wafer of FIG. 2, and a schematic of that portion of the wafer on which the test pattern is formed.
Figure 10B:
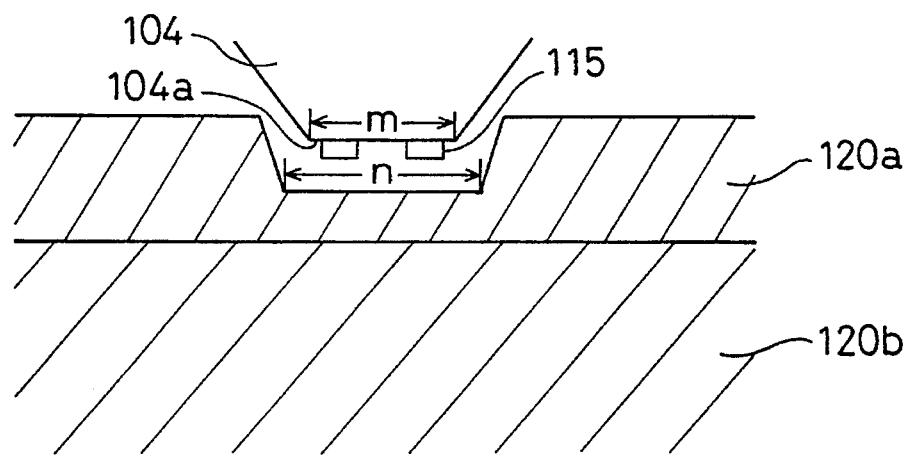

FIGS. 10(a) and 10(b) illustrate a test pattern formed on a part of the semi-conductor wafer of FIG. 2. More particularly, FIG. 10(a) is a plan view illustrating the semi-conductor wafer 120 with a test pattern 123 formed thereon and FIG. 10(b) is an enlarged cross section of part of the test pattern shown in FIG. 10(a).

In this embodiment, the test pattern 123 is formed on the center of the semi-conductor wafer 120 along with a number of semi-conductor chips 122 as illustrated in FIG. 10(a). A plurality of test patterns 123 may be formed on one semi-conductor wafer according to the requirements.

As shown in FIG. 10(b), it is preferable that a dimension 'n' of the measuring portion of the test pattern 123 be greater than a diameter 'm' of the bottom face 104a of the prism 104 to which the electrode 115 is attached. Some projections and concavities of not less than 1 micrometer are formed on the surface of the semi-conductor wafer by etching or another similar process. When the dimension 'n' of the measuring portion is undesirably small, the bottom face 104a of the prism 104 comes into contact with such a concavity or projection during the measurement.

In electrical measurement of the semi-conductor wafer 120 with the test pattern 123 formed on a part of the semi-conductor wafer 120, the position of the test pattern 123 is preferably adjusted relative to the electrode 115 in the X-Y direction, so that the electrode 115 comes immediately above the test pattern 123.

For positional adjustment of the test pattern 123 formed on the semi-conductor wafer 120 relative to the electrode 115, the semi-conductor wafer 120 mounted on the stage 130 is moved in the X-θ direction by means of the orientation flat position detector 116, the X-θ table 160, and the X-θ table control unit 117.

FIGS. 11(*a*) and 11(*b*) show a physical structure of the X-θ table 160 shown in FIG. 2. In particular, FIG. 11(*a*) is a plan view and FIG. 11(*b*) is a cross sectional view taken on the line XIb—XIb of FIG. 11(*a*). The X-θ table 160 includes a table 161 movable in the X direction. As viewed in FIGS. 11(*a*) and 11(*b*), table 161 is supported on its left and right ends by a linear guide 164 via a pair of rollers 165 and is movable along the linear guide 164 on the rollers 165.

A hole, through a ball screw 163 passes in the X direction, is formed in the table 161 and has an inner wall threaded to engage with the ball screw 163. The ball screw 163 is arranged parallel to the linear guide 164. A pulse motor 162 for driving and rotating the ball screw 163 is attached to one end of the ball screw 163.

Another hole through which a rotating shaft 168 passes in the Z direction, is also formed in the table 161. The rotating shaft 168 is fitted in the hole via a bearing to allow rotational movements thereof. The stage 130 is fixed on an upper end of the rotating shaft 168. The stage 130 is accordingly movable with the rotating shaft 168 around the shaft 168, that is, in the θ direction.

Another pulse motor 167, for driving and rotating the rotating shaft 168, is mounted on a bottom face of the table 161. The pulse motor 167 and the rotating shaft 168 are connected with each other via a set of bevel gears. A through hole is formed in the rotating shaft 168 and connected with the pipe 110 to allow vacuum (suction) to reach the upper surface of stage 130.

Rotations of the ball screw 163 driven by the pulse motor 162 move the table 161 in the X direction, while rotations of the rotating shaft 168 driven by the pulse motor 167 rotate the stage 130 in the θ direction.

The position of the test pattern 123 formed on the semi-conductor wafer 120 is adjusted relative to the electrode 115 in the following manner. When the semi-conductor wafer 120 mounted on the stage 130 is sucked onto the stage 130 by means of the dry vacuum pump 140, the pulse motor 167 drives the rotating shaft 168 to rotate the semi-conductor wafer 120 together with the stage 130. The orientation flat position detector 116 disposed at one end of the semi-conductor wafer 120 as shown in FIG. 2 detects the position of an orientation flat of the semi-conductor wafer 120.

Figure 12A:
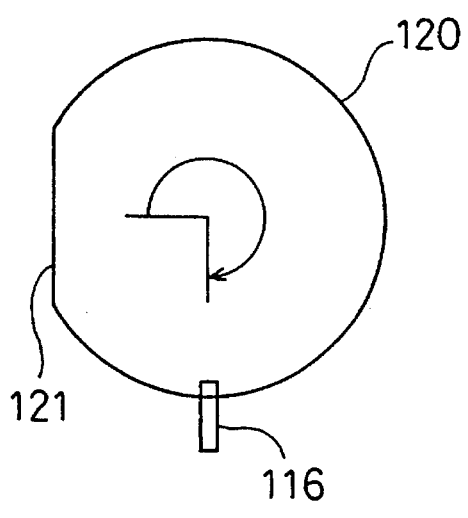
FIGS. 12(a) and 12(b) illustrate a process for detecting the position of an orientation flat of the semi-conductor wafer 120 using the orientation flat position detector 116 of FIG. 2.
Figure 12B:
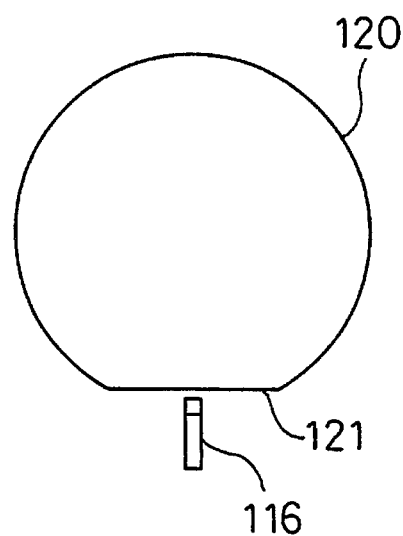

FIGS. 12(*a*) and 12(*b*) are provided herein to simplify explanation of a process for detecting the position of an orientation flat of the semi-conductor wafer 120 with the orientation flat position detector 116 of FIG. 2. When an orientation flat 121 of the semi-conductor wafer 120 is not located at the position of the orientation flat position detector 116 as shown in FIG. 12(*a*), a ray emitted from the emission unit 116*a* (FIG. 2) of the orientation flat position detector 116 is screened by the semi-conductor wafer 120 and does not enter the detector unit 116*b*. When the orientation flat 121 is located at the position of the orientation flat position detector 116 as shown in FIG. 12(*b*), on the contrary, a ray emitted from the emission unit 116*a* is not screened by the semi-conductor wafer 120 and enters the detector unit 116*b*. This system determines whether or not the orientation flat 121 is located at the position of the orientation flat position detector 116.

Under the condition that both the location of the orientation flat position detector 116 and the position of the test pattern 123 formed on the semi-conductor wafer 120 relative to the orientation flat 121 are known, the host controller 114 shown in FIG. 2 controls the X-θ table 160 via the X-θ table control unit 117 and shifts the semi-conductor wafer 120 in the X-θ direction relative to the electrode 115 so as to adjust the position of the test pattern 123 formed on the semi-conductor wafer 120 relative to the electrode 115.

Although the stage 130 includes the metal base 130*b* in the above embodiment, the base of the stage 130 may be composed of a non-metal material, as long as it allows the stage 130 to function normally as a measurement electrode. Any conductor or semi-conductor having the resistivity of not greater than 1 Ωcm may be used as the material of the base.

In the above embodiment, the positional adjustment of the test pattern 123 formed on the semi-conductor wafer 120 relative to the electrode 115 is implemented by detecting the position of the orientation flat 121 of the semi-conductor wafer 120. Alternatively the positional adjustment can be executed by detecting a mark which has been previously formed at a specific corner of the test pattern 123.

Figure 13:
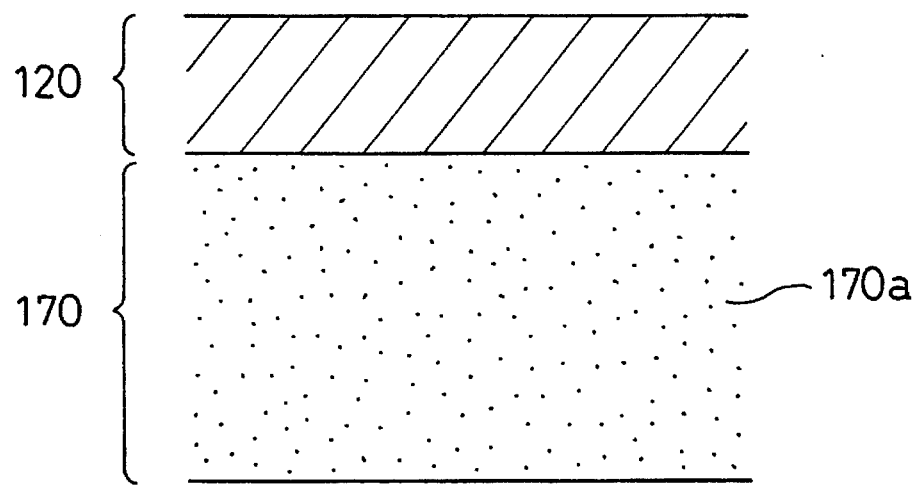
FIG. 13 is a fragmentary cross section of part constructed according to a stage 170 used in an apparatus of a second embodiment of this invention for electrically measuring properties of semi-conductor wafers.

FIG. 13 is a fragmentary cross section of part of a stage 170 used in the apparatus of a second embodiment for electrically measuring properties of semi-conductor wafers. The second embodiment has a similar structure to that of the first embodiment shown in FIG. 2 except for a different stage 170 on which the semi-conductor wafer 120 is mounted. The stage 170 shown in FIG. 13 is composed of semi-conductor material 170*a* having the resistivity of not greater than 1 Ωcm.

Examples of the semi-conductor material 170*a* include silicon (Si), germanium (Ge), gallium arsenide (GaAs), and indium phosphide (InP).

The rear face of the semi-conductor wafer 120 mounted on the stage 170 thus constructed comes into contact not with metal but with the semi-conductor material 170*a*. Since the semi-conductor material 170*a* does not contain simple substances of any metals, the rear face of the semi-conductor wafer 120 is not contaminated with metal. The semi-conductor material 170*a*, which may be used as a primary constituent of the semi-conductor wafer 120, does not have any adverse effect on the semi-conductor wafer 120 nor does stage 170 contaminate the rear face of the semi-conductor wafer 120 with any harmful material.

Since the semi-conductor material 170*a* has the resistivity of not greater than 1 Ωcm, the stage 170 composed of only the semi-conductor material 170*a*, as shown in FIG. 13, does not introduce any problems in operation of the stage 170 as a measurement electrode.

Figure 14:
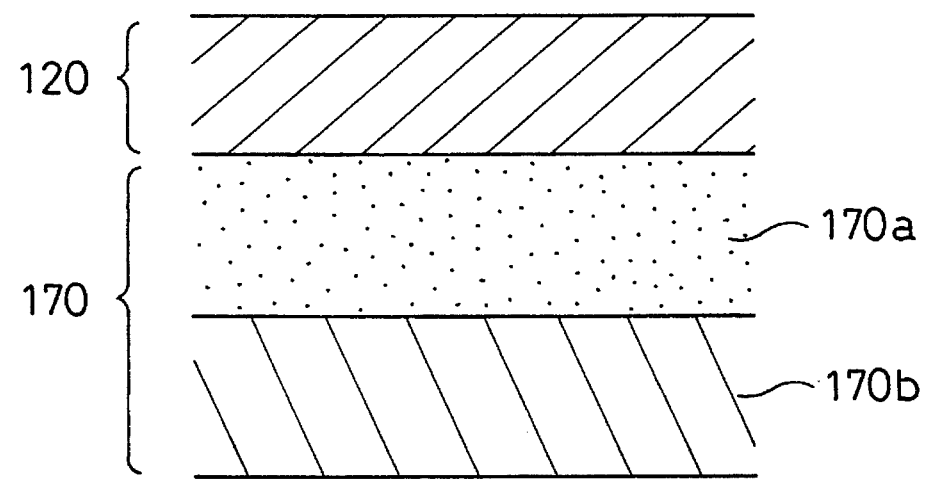
FIG. 14 is a fragmentary cross section showing another possible structure of the stage 170.

FIG. 14 is a cross sectional view showing another possible structure of the stage 170. In this example, the stage 170 includes a metal layer 170*b* and a semi-conductor material 170*a* having the resistivity of not greater than 1 Ωcm formed on the metal 170*b*. This structure has the same effects as described above. Another conductor may be applied instead of the metal 170*b*.

The structure of the second embodiment effectively protects the rear face of the semi-conductor wafer 120 mounted on the stage 170 from contamination with metal. After measurement of electrical properties, the semi-conductor wafer 120 can be detached from the stage 170 and returned to the manufacture process of semi-conductor products.

The structure of the second embodiment allows real products of semi-conductor wafers to be used for electrical measurement. The embodiment does not require any dummy semi-conductor wafers and thereby effectively reduces the cost.

There may be many other modifications, alterations, and changes without departing from the scope or spirit of essential characteristics of the invention. It is thus clearly understood that the above embodiment is only illustrative and not restrictive in any sense. The scope and spirit of the present invention are limited only by the terms of the appended claims.

What is claimed is:

1. An apparatus for electrically measuring properties of a semi-conductor wafer, comprising:

a stage on which said semi-conductor wafer is to be mounted, said stage being used as a measurement electrode in said measuring;

said stage comprising
   a conductive base, and
   an anti-metal contamination film formed on said conductive base;
   said anti-metal contamination film being free from simple substances of metals, said anti-metal contamination film being adapted to come into contact with said semi-conductor wafer so as to protect said semi-conductor wafer from contamination by metal.

2. An apparatus in accordance with claim 1, wherein said anti-metal contamination film comprises a film whose material is selected from the group consisting of semi-conductor material, semi-conductor oxide, semi-conductor nitride, and semi-conductor carbide.

3. An apparatus in accordance with claim 2, wherein said conductive base is constructed of semi-conductor having a resistivity of not larger than 1 $\Omega$cm.

4. An apparatus in accordance with claim 2 further comprising another electrode arranged above said semi-conductor wafer that is mounted on said stage and is spaced by a predetermined distance from said semi-conductor wafer, said another electrode being used as another measurement electrode.

5. An apparatus in accordance with claim 2 further comprising a dry vacuum pump for generating suction forces that draw said semi-conductor wafer onto said stage.

6. An apparatus in accordance with claim 5 further comprising:

a vacuum line running from said dry vacuum pump to said semi-conductor wafer; and a trap disposed in said vacuum line.

7. An apparatus in accordance with claim 1, wherein said anti-metal contamination film comprises a film whose material is polytetrafluoroethylene.

8. An apparatus in accordance with claim 7, wherein said conductive base is constructed of semi-conductor having a resistivity of not larger than 1 $\Omega$cm.

9. An apparatus sin accordance with claim 7 further comprising another electrode arranged above said semi-conductor wafer that is mounted on said stage and is spaced by a predetermined distance from said semi-conductor wafer, said another electrode being used as another measurement electrode.

10. An apparatus in accordance with claim 7 further comprising a dry vacuum pump for generating suction forces that draw said semi-conductor wafer onto said stage.

11. An apparatus in accordance with claim 10, said apparatus further comprising:

a vacuum line running from said dry vacuum pump to said semi-conductor wafer; and a trap disposed in said vacuum line.

12. An apparatus in accordance with claim 1, wherein said conductive base is constructed of semi-conductor having a resistivity of not larger than 1 $\Omega$cm.

13. An apparatus in accordance with claim 1 further comprising another electrode arranged above said semi-conductor wafer that is mounted on said stage and is spaced by a predetermined distance from said semi-conductor wafer, said another electrode being used as another measurement electrode.

14. An apparatus in accordance with claim 1 further comprising a dry vacuum pump for generating suction forces that draw said semi-conductor wafer onto said stage.

15. An apparatus in accordance with claim 14, said apparatus further comprising:

a vacuum line running from said dry vacuum pump to said semi-conductor wafer; and a trap disposed in said vacuum line.

16. An apparatus for electrically measuring properties of a semi-conductor wafer, comprising:

a stage on which said semi-conductor is to be mounted, said stage being used as a measurement electrode in said measuring, said stage comprising a semi-conductor element constructed of semi-conductor having a resistivity of not larger that 1 $\Omega$cm, said semi-conductor element being adapted to come into contact with said semi-conductor wafer.

17. An apparatus in accordance with claims 16 further comprising another electrode arranged above said semi-conductor wafer that is mounted on said stage and is spaced by a predetermined distance from said semi-conductor wafer, said another electrode being used as another measurement electrode.

18. An apparatus in accordance with claim 16 further comprising a dry vacuum pump for generating suction forces that draw said semi-conductor wafer onto said stage.

19. An apparatus in accordance with claim 18, said apparatus further comprising:

a vacuum line running from said dry vacuum pump to said semi-conductor wafer; and a trap disposed in said vacuum line.

20. A method of electrically measuring properties of a semi-conductor wafer, said method comprising:

step (a) of providing a stage which comprises a conductive base and an anti-metal contamination film formed on said conductive base, said anti-metal contamination film being free from simple substances of metals;

step (b) of mounting said semi-conductor wafer onto said anti-metal contamination film of said stage; and step (c) of electrically measuring the properties of said semi-conductor wafer by using said stage as a measurement electrode.

21. A method in accordance with claim 20, wherein said step (a) further comprises a step of constructing said anti-metal contamination film of material that is selected from the group consisting of semi-conductor material, semi-conductor oxide, semi-conductor nitride, and semi-conductor carbide.

22. A method in accordance with claim 21, wherein said step (a) further comprises a step of constructing said conductive base of semi-conductor having a resistivity of not larger than 1 $\Omega$cm.

23. A method in accordance with claim 20, wherein said step (a) further comprises a step of constructing said anti-metal contamination film of polytetrafluoroethylene.

24. A method in accordance with claim 23, wherein said step (a) further comprises a step of constructing said conductive base of semi-conductor having a resistivity of not larger than 1 Ωcm.

25. A method of electrically measuring properties of a semi-conductor wafer, said method comprising:

step (a) of providing a stage comprising a semi-conductor element made of semi-conductor having a resistivity of not larger than 1 Ωcm;

step (b) of mounting said semi-conductor wafer onto said semi-conductor element of said stage; and step (c) of electrically measuring properties of said semi-conductor wafer by using said stage as a measurement electrode.

* * * * *